United States Patent [19]

Partlo

[11] Patent Number: 5,763,930
[45] Date of Patent: Jun. 9, 1998

[54] PLASMA FOCUS HIGH ENERGY PHOTON SOURCE

[75] Inventor: William Norman Partlo, San Diego, Calif.

[73] Assignee: CYMER, Inc., San Diego, Calif.

[21] Appl. No.: 854,507

[22] Filed: May 12, 1997

[51] Int. Cl.$^6$ .................................................. H01J 35/20
[52] U.S. Cl. .................... 250/504 R; 250/493.1; 378/119
[58] Field of Search .................... 250/504 R, 493.1; 378/119

[56] References Cited

U.S. PATENT DOCUMENTS

| | | | |
|---|---|---|---|
| 3,150,483 | 9/1964 | Mayfield et al. | 60/35.5 |
| 3,232,046 | 2/1966 | Meyer | 60/35.5 |
| 3,279,176 | 10/1966 | Boden | 60/202 |
| 3,961,197 | 6/1976 | Dawson | 250/493 |
| 3,969,628 | 7/1976 | Roberts et al. | 250/402 |
| 4,143,275 | 3/1979 | Mallozzi et al. | 378/119 |
| 4,203,393 | 5/1980 | Giardini | 123/30 |
| 4,364,342 | 12/1982 | Asik | 123/143 B |
| 4,369,758 | 1/1983 | Endo | 123/620 |
| 4,504,964 | 3/1985 | Cartz et al. | 378/119 |
| 4,507,588 | 3/1985 | Asmussen et al. | 315/39 |
| 4,536,884 | 8/1985 | Weiss et al. | 378/119 |
| 4,538,291 | 8/1985 | Iwamatsu | 378/119 |
| 4,561,406 | 12/1985 | Ward | 123/536 |
| 4,618,971 | 10/1986 | Weiss et al. | 378/119 |
| 4,633,492 | 12/1986 | Weiss et al. | 378/119 |
| 4,635,282 | 1/1987 | Okada et al. | 378/34 |
| 4,774,914 | 10/1988 | Ward | 123/162 |
| 4,837,794 | 6/1989 | Riordan et al. | 378/119 |
| 5,023,897 | 6/1991 | Neff et al. | 378/119 |
| 5,175,755 | 12/1992 | Kumakhov | 378/34 |
| 5,241,244 | 8/1993 | Cirri | 315/111.41 |
| 5,442,910 | 8/1995 | Anderson | 60/266 |
| 5,499,282 | 3/1996 | Silfvast | 378/119 |

OTHER PUBLICATIONS

Bailey et al, "Evaluation of the gas puff z pinch as an x–ray lithography and microscopy source," *Appl. Phys. Lett. 40(1)*, pp. 33–35 (Jan. 1, 1982).

Choi et al., "Temporal development of hard and soft x–ray emission from a gas–puff Z pinch," *Rev. Sci. Instrum. 57(8)*, pp. 2162–2164 (Aug. 1986).

Giordano and Letardi, "Magnetic pulse compressor for prepulse discharge in spiker–sustainer excitati technique for XeCl lasers," *Rev. Sci. Instrum. 65(8)*, Aug. 1994, pp. 2475–2481.

Jahn. *Physics of Electric Propulsion*, McGraw–Hill Book Company (Series in Missile and Space U.S.A., 1968. Chap.9, "Unsteady Electromagnetic Acceleration, " p. 257.

Lowe, "Gas plasmas yield X rays for lithography, "*Electronics*, Jan. 27, 1982, pp. 40–41.

Mather, "Formation of a High–Density Deuterium Plasma Focus," *The Physics of Fluids 8(2)*, Feb. 1965, 366–377.

Matthews and Cooper, "Plasma sources for x–ray lithography,"*SPIE Vol. 333*, Submicron Lithography,1982,pp. 136–139.

Pearlman and Riordan, "X–ray lithography using a pulsed plasma source," *J. Vac. Sci. Technol.* Nov./Dec. 1981, pp. 1190–1193.

Shiloh et al., "Z Pinch of a Gas Jet," *Physical Review Letters 40(8)*, Feb. 20, 1978, pp.

Stallings et al., "Imploding argon plasma experiments," *Appl. Phys. Lett. 35(7)*, Oct. 1,1 pp. 524–526.

Primary Examiner—Jack I. Berman
Attorney, Agent, or Firm—John R. Ross

[57] ABSTRACT

A high energy photon source. A pair of plasma pinch electrodes are located in a vacuum chamber. A working gas supply system supplies a working gas which includes a noble buffer gas and an active gas chosen to provide a desired spectral line. A pulse power source for provides electrical pulses at a frequency of at least 100 Hz and a voltages high enough to create electrical discharge between the electrodes to produce very high temperature, high density plasma pinches in the working gas providing radiation at the spectral line of the active gas. An external reflection radiation collector-director collects radiation produced in the plasma pinches and directs the radiation in a desired direction. In a preferred embodiment the active gas is lithium and the buffer gas is helium and the radiation-collector is coated with the material used for the electrodes. That material is tungsten.

6 Claims, 2 Drawing Sheets

PLASMA FOCUS HIGH ENERGY PHOTON SOURCE

This invention relates to high energy photon sources and in particular highly reliable x-ray and high energy ultraviolet sources.

BACKGROUND OF THE INVENTION

The semiconductor industry continues to develop lithographic technologies which can print ever smaller integrated circuit dimensions. These systems must have high reliability, cost effective throughput, and reasonable process latitude. The integrated circuit fabrication industry is presently changing over from mercury G-line (436 nm) and I-line (365 nm) exposure sources to 248 nm and 193 nm excimer laser sources. This transition was precipitated by the need for higher lithographic resolution with minimum loss in depth-of-focus.

The demands of the IC industry will soon exceed the resolution capabilities of 193 nm exposure sources, thus creating a need for a reliable exposure source at a wavelength significantly shorter than 193 nm. An excimer line exists at 157 nm, but optical materials with sufficient transmission at this wavelength are unavailable. Therefore, all-reflective imaging systems must be used. An all reflective optical system requires a smaller numerical aperture than the transmissive systems. The loss in resolution caused by the smaller NA can only be made up by reducing the wavelength by a large factor. Thus, a light source in the range of 10 nm is required if the resolution of optical lithography is to be improved beyond that achieved with 193 nm.

The present state of the art in high energy ultraviolet and x-ray sources utilizes plasmas produced by bombarding various target materials with laser beams, electrons or other particles. Solid targets have been used, but the debris created by ablation of the solid target has detrimental effects on various components of a system intended for production line operation. A proposed solution to the debris problem is to use a frozen liquid or frozen gas target so that the debris will not plate out onto the optical equipment. However, none of these systems have proven to be practical for production line operation.

It has been well known for many years that x-rays and high energy ultraviolet radiation could be produced in a plasma pinch operation. In a plasma pinch an electric current is passed through a plasma in one of several possible configuration such that the magnetic field created by the flowing electric current accelerates the electrons and ions in the plasma into a tiny volume with sufficient energy to cause substantial stripping of inner electrons from the ions and a consequent production of x-rays and high energy ultraviolet radiation. Various prior art techniques for generation of high energy radiation from focusing or pinching plasmas are described in the following patents:

J. M. Dawson, "X-Ray Generator," U.S. Pat. No. 3,961,197, Jun. 1, 1976.

T. G. Roberts, et. al., "Intense, Energetic Electron Beam Assisted X-Ray Generator," U.S. Pat. No. 3,969,628, Jul. 13, 1976.

J. H. Lee, "Hypocycloidal Pinch Device," U.S. Pat. No. 4,042,848, Aug. 16, 1977.

L. Cartz, et. al., "Laser Beam Plasma Pinch X-Ray System," U.S. Pat. No. 4,504,964, Mar. 12, 1985.

A. Weiss, et. al., "Plasma Pinch X-Ray Apparatus," U.S. Pat. No. 4,536,884, Aug. 20, 1985.

S. Iwamatsu, "X-Ray Source," U.S. Pat. No. 4,538,291, Aug. 27, 1985.

A. Weiss, et. al. "X-Ray Lithography System," U.S. Pat. No. 4,618,971, Oct. 21, 1986.

A. Weiss, et. al., "Plasma Pinch X-ray Method," U.S. Pat. No. 4,633,492, Dec. 30, 1986.

I. Okada, Y. Saitoh, "X-Ray Source and X-Ray Lithography Method," U.S. Pat. No. 4,635,282, Jan. 6, 1987.

R. P. Gupta, et. al., "Multiple Vaccum Arc Derived Plasma Pinch X-Ray Source," U.S. Pat. No. 4,751,723, Jun. 14, 1988.

R. P. Gupta, et. al., "Gas Discharge Derived Annular Plasma Pinch X-Ray Source," U.S. Pat. No. 4,752,946, Jun. 21, 1988.

J. C. Riordan, J. S. Pearlman, "Filter Apparatus for use with an X-Ray Source," U.S. Pat. No. 4,837,794, Jun. 6, 1989.

D. A. Hammer, D. H. Kalantar, "Method and Apparatus for Microlithography Using X-Pinch X-Ray Source," U.S. Pat. No. 5,102,776, Apr. 7, 1992.

M. W. McGeoch, "Plasma X-Ray Source," U.S. Pat. No. 5,504,795, Apr. 2, 1996.

What is needed is a production line reliable, simple system for producing high energy ultraviolet and x-radiation which avoids prior art problems associated with debris formation.

SUMMARY OF THE INVENTION

The present invention provides a high energy photon source. A pair of plasma pinch electrodes are located in a vacuum chamber. A working gas supply system supplies a working gas which includes a noble buffer gas and an active gas chosen to provide a desired spectral line. A pulse power source provides electrical pulses at a frequency of at least 100 Hz and at voltages high enough to create electrical discharge between the electrodes to produce very high temperature, high density plasma pinch in the working gas providing radiation at the spectral line of the active gas. An external reflection radiation collector-director collects radiation produced in the plasma pinches and directs the radiation in a desired direction. In a preferred embodiment the active gas is lithium and the buffer gas is helium and the radiation-collector is coated with the material used for the electrodes. A good choice for the material is tungsten.

DETAILED DESCRIPTION OF PREFERRED EMBODIMENTS

First Preferred Embodiment

Figure 1:
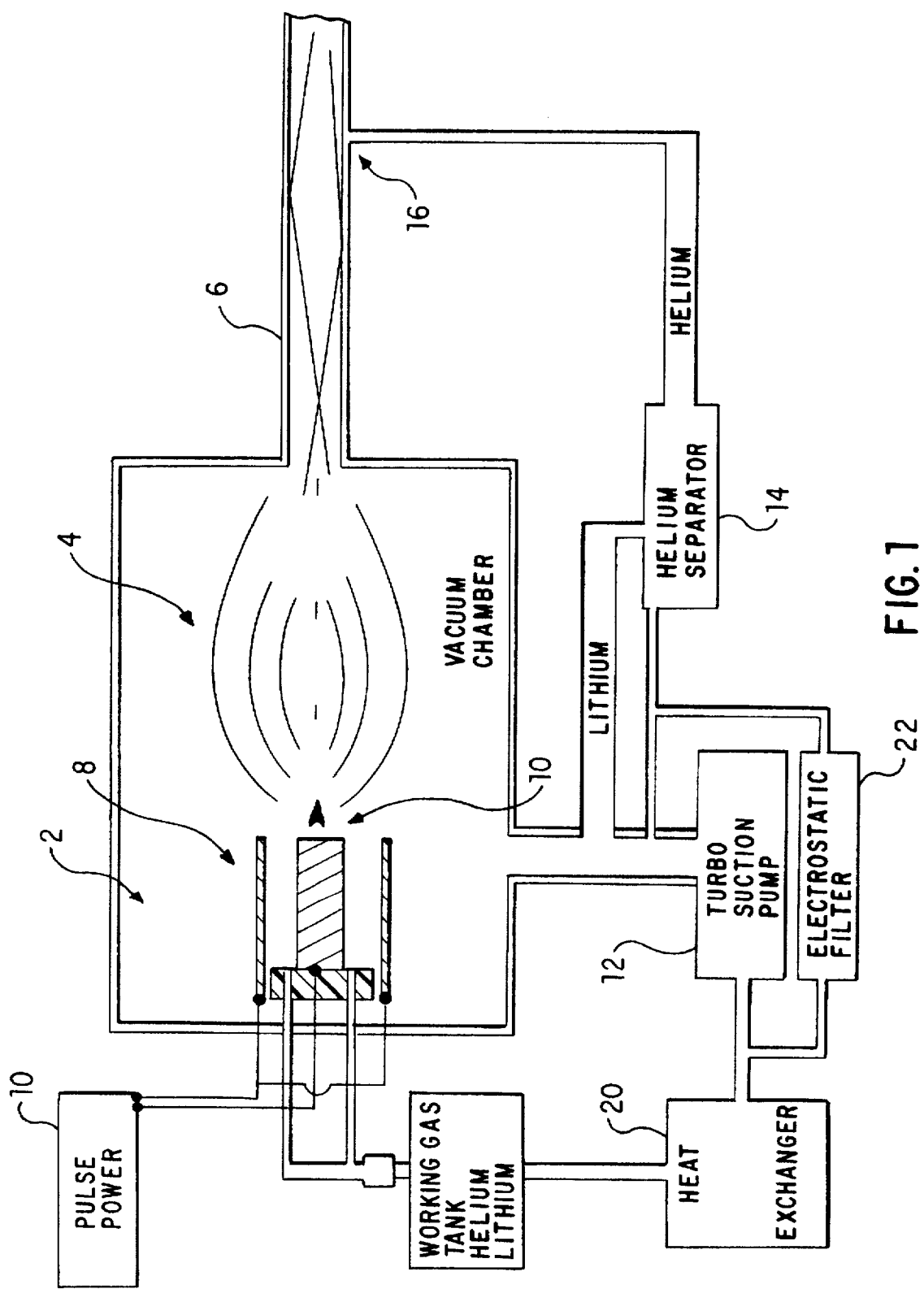
FIG. 1 is a drawing of a high energy photon source utilizing the present invention.

A simplified drawing of high energy ultraviolet light source is shown in FIG. 1. The major components are a plasma pinch unit 2, a high energy photon collector 4 and a hollow light pipe 6. The plasma pinch source comprises a coaxial electrode 8 powered by a low inductance pulse power circuit 10. The pulse power circuit in this preferred embodiment is a high voltage, energy efficient circuit capable of providing 100 ns to 500 ns pulses in the range of 1 kV to 2 kV to coaxial electrode 8 at a rate of 1,000 Hz.

A small amount of working gas, such as a mixture of helium and lithium vapor, is present near the base of the electrode 8 as shown in FIG. 1. At each high voltage pulse, avalanche breakdown occurs between the inner and outer electrodes of coaxial electrode 8 either due to self breakdown. The avalanche process occurring in the buffer gas ionizes the gas and creates a conducting plasma between the electrodes at the base of the electrodes. Once a conducting plasma exists, current flows between the inner and outer electrodes. In this preferred embodiment, the outer electrode is at high voltage and inner electrode is at ground potential. Current will flow from the outer electrode to the inner electrode and thus electrons will flow away from the center and ions will flow toward the center. This current flow generates a magnetic field which acts upon the moving charge carriers accelerating them away from the base of the coaxial electrode 8.

When the plasma reaches the end of the center electrode, the electrical and magnetic forces on the plasma, pinch the plasma to a "focus" around a point 10 along the centerline of and a short distance beyond the end of the central electrode and the pressure and temperature of the plasma rise rapidly reaching extremely high temperatures, in come cases as high as the temperature at the surface of the sun! The dimensions of the electrodes and the total electrical energy in the circuit are preferably optimized to produce the desired black body temperature in the plasma. For the production of radiation in the 13 nm range a black body temperature of about 100 eV is required. In general, for a particular coaxial configuration, temperature will increase with increasing voltage of the electrical pulse. The shape of the radiation spot is somewhat irregular in the axial direction and roughly gausian in the radial direction. The about 95 percent of the energy irradiated is from a volume with a radius of about 1 mm.

In most prior art plasma pinch units described in the technical literature, the radiation spot emits radiation in all directions with a spectrum closely approximating a black body. The purpose of the lithium in the working gas is to narrow the spectrum of the radiation from the radiation spot.

Lithium Vapor

Doubly ionized lithium exhibits an electronic transition at 13 nm and serves as the radiation source atom in the buffer of helium. Doubly ionized lithium is an excellent choice for two reasons. The first is the low melting point and high vapor pressure of lithium. The lithium ejected from the radiation spot can be kept from plating out onto the chamber walls and collection optics by simply heating these surfaces to 50°–100° C. The vapor phase lithium can then be pumped from the chamber along with the helium buffer gas using standard turbo-molecular pumping technology. And the lithium can be easily separated from the helium merely by cooling the two gases The second advantage of using lithium as the source atom is that non-ionized lithium has a low absorption cross section for 13 nm radiation. Any ionized lithium ejected from the radiation spot can be easily swept away with a moderate electric field. The remaining non-ionized lithium is essentially transparent to 13 nm radiation. The currently most popular proposed 13 nm source makes use of a laser ablated frozen jet of xenon. Such a system must capture virtually all of the ejected xenon before the next pulse because the absorption cross section for xenon at 13 nm is large.

Radiation Collector

The radiation produced at the radiation spot is emitted uniformly into a full 4Π steradians. Some type of collection optics is needed to capture this radiation and direct it toward the lithography tool. Previously proposed 13 nm light sources suggested collection optics based on the use of multi-layer dielectric coated mirrors. The use of multi-layer dielectric mirrors is used to achieve high collection efficiency over a large angular range. Any radiation source which produced debris would coat these dielectric mirrors and degrade their reflectivity, and thus reduce the collected output from the source. This preferred system will suffer from electrode erosion and thus would, over time, degrade any dielectric mirror placed in proximity to the radiation spot.

Thus our choice of a radiation collector is to utilize a technique previously developed for collection of hard x-ray radiation. This technique exploits the fact that many materials have an index of refraction having a real component less than unity in the x-ray region. Total reflection can be achieved at angles were Snell's law dictates that the refracted angle inside the reflector material would be greater than 90°. Some materials such as tungsten exhibit total external reflection up to 18° from grazing incidence at 13 nm.

To produce a collector capable of accepting a large cone angle, several conical sections can be nested inside each other. Each conical section may employ more than one reflection of the radiation to redirect its section of the radiation cone in the desired direction. We estimate that we can collect and direct the 13 nm radiation being emitted over a solid angle of least 25 degrees.

Tungsten Electrodes—Tungsten Coatings for Collector In choosing the material for the total external reflection collector, it is preferred that the coating material on the collector be the same as the electrode material. Tungsten is a promising candidate since it has demonstrated performance as an is electrode and the real part of its refractive index at 13 nm is 0.945. Using the same material for the electrode and the mirror coating eliminates the degradation of mirror reflectivity as the eroded electrode material plates out onto the collection mirror.

Light Pipe

It is important to keep deposition materials away from the illumination optics of the lithography tool. Therefore, a light pipe 6 is preferred to further assure this separation. The lightpipe 6 is a hollow lightpipe which also employs substantially total external reflection on its inside surfaces. The primary collection optic can be designed to reduce the cone angle of the collected radiation to match the acceptance angle of the hollow lightpipe. This concept is shown in FIG. 1.

The dielectric mirrors of the lithography tool would then be very well protected from any electrode debris since a tungsten or lithium atom would have to diffuse upstream against a flow of helium down the hollow lightpipe as shown in FIG. 1

Pulse Power Unit

The preferred pulse power unit 10 is a solid state high frequency, high voltage pulse power unit utilizing a solid state trigger and a magnetic switch circuit such as the pulse power units described in U.S. Pat. No. 5,142,166. These units are extremely reliable and can operate continuously without substantial maintenance for many months and billions of pulses. The teachings of U.S. Pat. No. 5,142,166 are incorporated herein by reference.

The System

Thus, as shown in FIG. 1, in this preferred embodiment, a working gas mixture of helium and lithium vapor at a temperature of about 90 degrees C. is discharged into coaxial electrode 8. Electrical pulses from pulse power unit 10 create a dense plasma focus at 10 at sufficiently high temperatures and pressures to doubly ionize the lithium atoms in the working gas generating ultraviolet radiation at about 13 nm wavelength.

This light is collected in total external reflection collector 4 and directed into hollow light pipe 6 where the light is further directed to a lithography tool (not shown). Discharge chamber 1 is maintained at a vacuum of about 4 Torr with turbo suction pump 12. Some of the helium in the working gas is separated in helium separator 14 and used to purge the lightpipe as shown in FIG. 1 at 16. The pressure of helium in the light pipe is preferably matched to the pressure requirements of the lithography tool which typically is maintained at a low pressure or vacuum. The temperature of the working gas is maintained at the desired temperature with heat exchanger 20 and the gas is cleaned with electrostatic filter 22. The gas is discharged into the coaxial electrode space as shown in FIG. 1.

Second Preferred Plasma Pinch Unit

Figure 2:
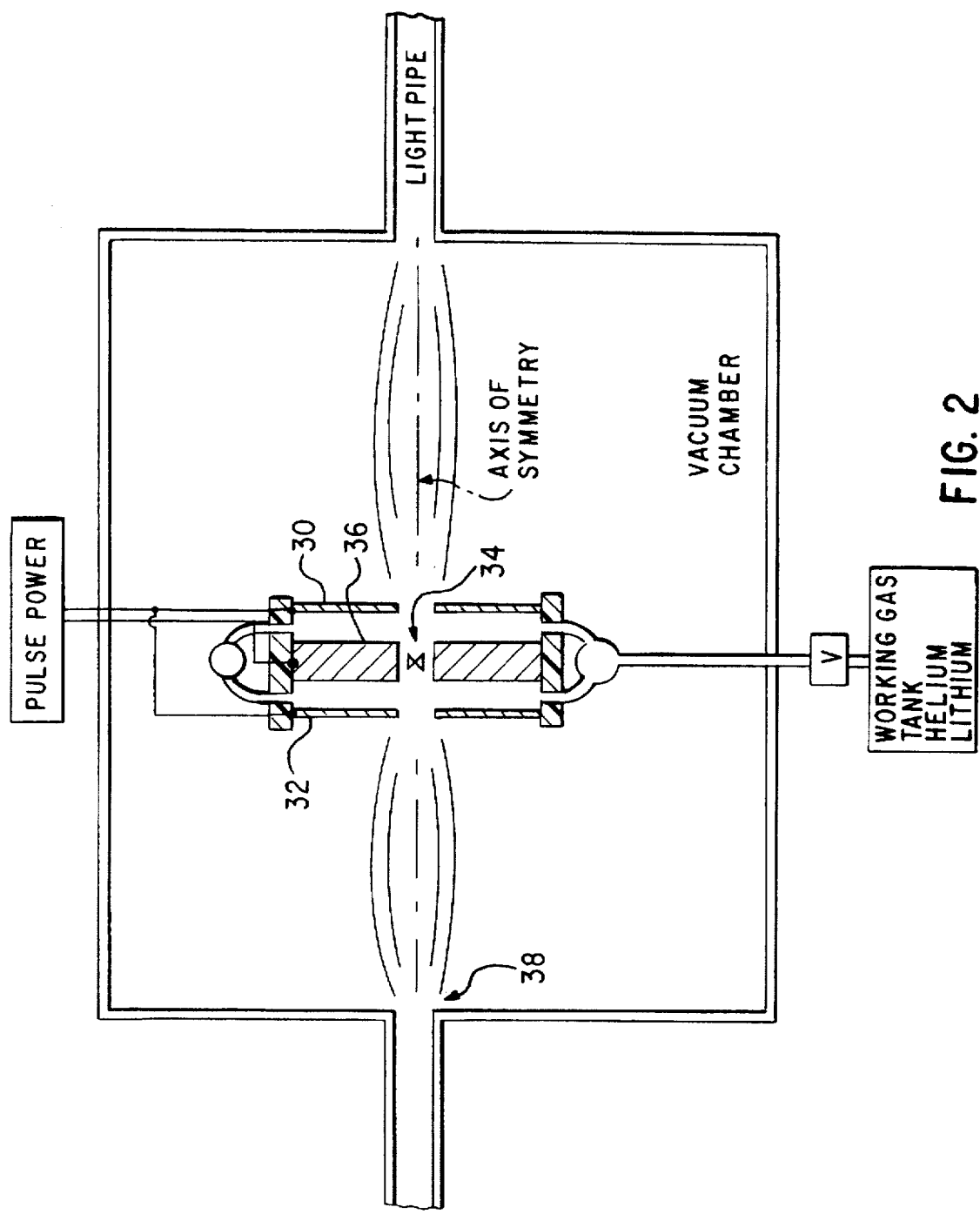
FIG. 2 is a drawing of a three dimensional plasma pinch device with disk shaped electrodes.

A second preferred plasma pinch unit is shown in FIG. 2. This unit is similar to the plasma pinch device described in U.S. Pat. No. 4,042,848. This unit comprises two outer disk shaped electrodes 30 and 32 and an inner disk shaped electrode 36. The pinch is created from three directions as described in U.S. Pat. No. 4,042,848 and as indicated in FIG. 2. The pinch starts near the circumference of the electrodes and proceeds toward the center and the radiation spot is developed along the axis of symmetry and at the center of the inner electrode as shown in FIG. 2 at 34. Radiation can be collected and directed as described with respect to the FIG. 1 embodiment. However, it is possible to capture radiation in two directions coming out of both sides of the unit as shown in FIG. 2. Also, by locating a dielectric mirror at 38, a substantial percentage of the radiation initially reflected to the left could be reflected back through the radiation spot. This should stimulate radiation toward the right side.

It is understood that the above described embodiments are illustrative of only a few of the many possible specific embodiments which can represent applications of the principals of the present invention. For example, instead of recirculating the working gas it may be preferable to merely trap the lithium and discharge the helium. Use of other electrode-coating combinations other than tungsten are also possible. For example copper or platinum electrodes and coatings would be workable. Other techniques for generating the plasma pinch can be substituted for the specific embodiment described. Some of these other techniques are described in the patents referenced in the background section of this specification, and those descriptions are all incorporated by reference herein. Many methods of generating high frequency high voltage electrical pulses are available and can be utilized. An alternative would be to keep the lightpipe at room temperature and thus freeze out both the lithium and the tungsten as it attempted to travel down the length of the lightpipe. This freeze-out concept would further reduce the amount of debris which reached the optical components used in the lithography tool since the atoms would be permanently attached to the lightpipe walls upon impact. Deposition of electrode material onto the lithography tool optics can be prevented by designing the collector optic to re-image the radiation spot through a small orifice in the primary discharge chamber and use a differential pumping arrangement. Helium can be supplied from the second chamber through the orifice into the first chamber. This scheme has been shown to be effective in preventing material deposition on the output windows of copper vapor lasers. Lithium hydride may be used in the place of lithium. The unit may also be operated as a static-fill system without the working gas flowing through the electrodes.

Accordingly, the reader is requested to determine the scope of the invention by the appended claims and their legal equivalents, and not by the examples which have been given.

What is claimed is:

1. A high energy photon source comprising:
    A. a vacuum chamber,
    B. at least two electrodes located within said vacuum chamber and defining an electrical discharge region and arranged to create high frequency plasma pinches upon electrical discharge,
    C. a working gas comprising an active gas and a buffer gas, said buffer gas being a noble gas, and said active gas being chosen to provide light at least one spectral line,
    D. a working gas supply system for supplying a working gas to said discharge region,
    E. a pulse power source for providing electrical pulses at a frequency of at least 100 Hz and a voltages high enough to create electrical discharge between said at least one pair of electrode,
    F. as external reflection radiation collector-director for collecting radiation produced in said plasma pinches and for directing said radiation in a desired direction.

2. A high energy photon source as in claim 1 wherein said active gas is lithium vapor.

3. A high energy photon source as in claim 1 wherein said active gas is lithium hydride.

4. A high energy photon source as in claim 1 and further comprising a light pipe arranged to transmit radiation collected and directed by said collector-director.

5. A high energy photon source as is claim 1 wherein said electrodes are comprised of an electrode material and said collector-directed is coated with the same electrode material.

6. A high energy photon source as in claim 1 wherein said at least two electrodes are three disk shaped electrodes defining two outer electrodes and an inner electrode, said two inner electrodes during operation being at a polarity opposite said inner electrode.

* * * * *

UNITED STATES PATENT AND TRADEMARK OFFICE
CERTIFICATE OF CORRECTION

| | | |
|---|---|---|
| PATENT NO. | : 5,763,930 | Page 1 of 1 |
| APPLICATION NO. | : 08/854507 | |
| DATED | : June 9, 1998 | |
| INVENTOR(S) | : William N. Partlo | |

It is certified that error appears in the above-identified patent and that said Letters Patent is hereby corrected as shown below:

<u>Column 6, Claim 1:</u>
Line 31, after "at" add --at--;
Line 38, "one pair of electrode" should be changed to --two electrodes--;
Line 39, change "as" to --an--.

<u>Column 6, Claim 5:</u>
Line 51, change "collector-directed" to --collector-director--.

<u>Column 6, Claim 6:</u>
Line 55, change "inner" to --outer--.

Signed and Sealed this

Eleventh Day of July, 2006

JON W. DUDAS
*Director of the United States Patent and Trademark Office*